United States Patent [19]

Shimazu et al.

[11] 4,443,703
[45] Apr. 17, 1984

[54] METHOD AND APPARATUS OF DEFLECTION CALIBRATION FOR A CHARGED PARTICLE BEAM EXPOSURE APPARATUS

[75] Inventors: Nobuo Shimazu; Tsuneo Okubo, both of Tokyo; Norio Saitou, Iruma; Susumu Ozasa, Kashiwa, all of Japan

[73] Assignees: Nippon Telegraph & Telephone Public Corporation; Hitachi, Ltd., both of Tokyo, Japan

[21] Appl. No.: 347,719

[22] Filed: Feb. 10, 1982

[30] Foreign Application Priority Data

Feb. 23, 1981 [JP] Japan .................................. 56-24327

[51] Int. Cl.³ ........................................... H01J 37/304
[52] U.S. Cl. ............................... 250/491.1; 250/492.2
[58] Field of Search ............... 250/491.1, 492.1, 252.1, 250/396 R, 397, 398, 400, 492.2

[56] References Cited

PUBLICATIONS

Asai et al., "Distortion Correction and Deflection Calibration...", *J. Vac. Sci. Technol.*, vol. 16, No. 6, Nov./Dec. 1979, pp. 1710–1714.

Woodard et al., "Variable Spot Shape Control Electronics", *J. Vac. Sci. Technol.*, vol. 16, No. 6, Nov./Dec. 1979, pp. 1783–1786.

*Primary Examiner*—Alfred E. Smith
*Assistant Examiner*—Jack I. Berman
*Attorney, Agent, or Firm*—Antonelli, Terry & Wands

[57] ABSTRACT

A method and apparatus of deflection calibration for a charged particle beam exposure apparatus having an electromagnetic deflector and an electrostatic deflector both for deflecting a charged particle beam and a movable stage structure. The electromagnetic deflector is previously subjected to a calibration operation known per se. With a fiducial mark positioned in a predetermined location, the beam is deflected by the calibrated electromagnetic deflector instead of moving the stage structure, the beam is then deflected by the electrostatic deflector to detect the location of the fiducial mark, and deflection data are measured of the electrostatic deflection for the detection of the location of the fiducial mark. According to the present invention the calibration is performed in a short time without causing degradation of the precision of, e.g., lithography due to heat generated by movement of the stage structure.

8 Claims, 4 Drawing Figures

METHOD AND APPARATUS OF DEFLECTION CALIBRATION FOR A CHARGED PARTICLE BEAM EXPOSURE APPARATUS

BACKGROUND OF THE INVENTION

This invention relates to a method and apparatus of deflection calibration or a charged particle beam exposure apparatus in which a charged particle beam such as an electron beam or an ion beam is directed at a high speed toward an object to expose the object to the beam for "writing" a desired pattern on the object with high precision.

A charged particle beam exposure apparatus as described above includes generally electromagnetic deflection means and electrostatic deflection means as means for deflecting the charged particle beam. Both of the electromagnetic deflection means and the electrostatic deflection means are jointly used in such an apparatus to obviate such defects that, when a field to be exposed to the beam which "writes" a desired pattern thereon is scanned with the electromagnetic deflection means alone, the beam deflection speed, hence, the writing speed is limited to a low value due to the hindrance such as an eddy current or a hysteresis phenomenon, while when such a field is scanned with the electrostatic deflection means alone, an excessive deflection astigmatism or the so-called sharpless beam concentration is inevitable. These problems are discussed in, for example, "The Electrochemical Society INC. Spring Meeting, St. Louis Mo.", May 11–16, 1980, extended Abstract p. 601 and "J. Vac. Sci. Technology," 16(6) November/December, 1979, p. 1686. Reference is to be made to these papers for details.

According to the prior art method relying on movement of a stage structure carrying an object to be subjected to charged particle beam exposure, for the purpose of deflection calibration for a charged particle beam exposure apparatus including deflection means as above described, the stage structure must be moved a multiplicity of times in required directions, as explained later with reference to the drawings, and, therefore, a long period of time is required for the above operation. Further, heat generated during the movement of the stage structure causes the distance between the fiducial mark and that portion of the stage structure which represents the portion of the stage structure to be measured by a laser interferometer to change and degrades the calibration precision, with a result that the lithography precision of the apparatus is greatly degraded.

SUMMARY OF THE INVENTION

With a view to obviate the prior art defects pointed out above, it is a primary object of the present invention to provide a method and apparatus of deflection calibration for a charged particle beam exposure apparatus, which can greatly shorten the length of time required for the deflection calibration and can also improve the lithography precision.

In accordance with the present invention which attains the above object, there is provided a method and apparatus of deflection calibration for a charged particle beam exposure apparatus having first deflection means (for example, an electromagnetic deflector) for scanning a relatively large area with a charged particle beam and second deflection means (for example, an electrostatic deflector) for scanning a relatively small area with the beam, wherein deflection by the first deflection means is calibrated in a known manner, and deflection by the second deflection means is calibrated using the calibrated first deflection means.

DESCRIPTION OF THE PREFERRED EMBODIMENTS

For a better understanding of the present invention, the aforementioned prior art problems will be explained in further detail with reference to FIGS. 1 to 3 before describing an embodiment of the method according to the present invention.

Figure 1:
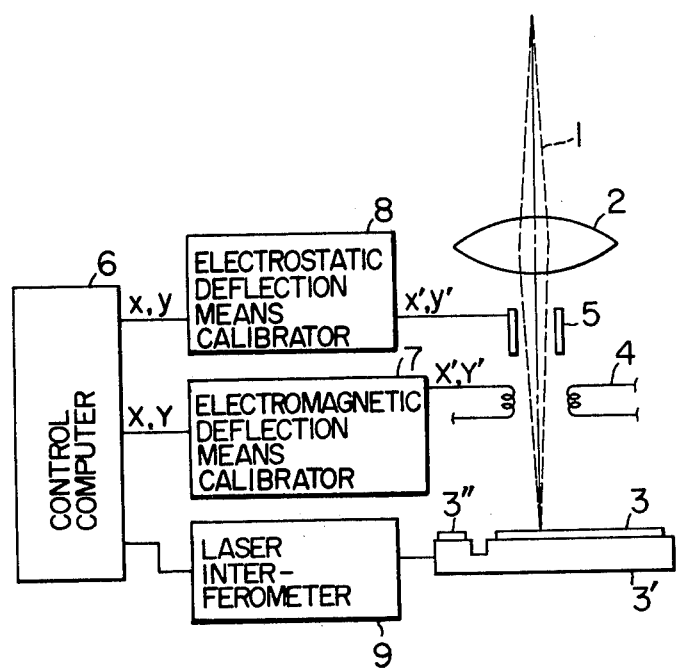
FIG. 1 is a diagrammatic view showing schematically and briefly the structure of a charged particle beam exposure apparatus to which the present invention is effectively applicable.

FIG. 1 shows schematically the structure of a deflection part usually employed in an electron beam exposure apparatus which is an example of a charged particle beam exposure apparatus to which the present invention is effectively applicable. Referring to FIG. 1, an electron beam 1 is focused by an electron lens 2 to form a beam spot (circular or rectangular) on an object 3 subjected to charged particle beam exposure. The electron beam 1 is deflected to have its beam spot moved on the object 3 by the combination of electromagnetic deflection means 4 and electrostatic deflection means 5.

Figure 2:
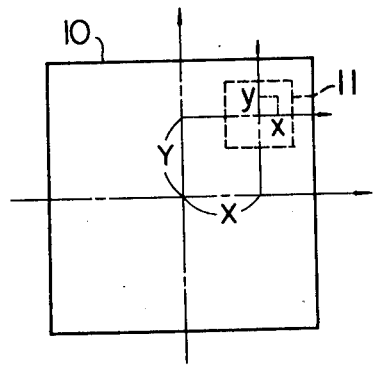
FIG. 2 illustrates a writing field and a manner of electromagnetic deflection calibration.
Figure 3:
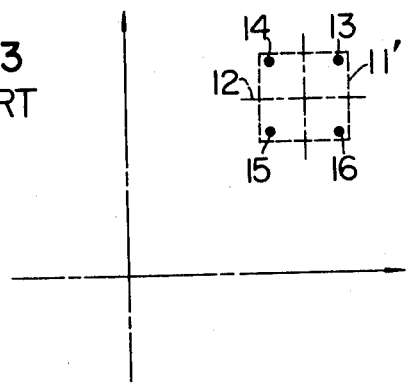
FIG. 3 illustrates a prior art manner of deflection calibration.

Referring to FIG. 2, the operation of these deflection means 4 and 5 will be briefly explained. A writing field 10 (which will be referred to hereinafter merely as a field) surrounded by the solid lines is divided into a plurality of small fields 11 (which will be referred to hereinafter as sub-fields) surrounded by the broken lines, although only one of such sub-fields 11 is shown in FIG. 2. The inner area of the sub-field 11 is exposed to the electron beam 1 deflected by the electrostatic deflection means 5 which can deflect the beam 1 at a high speed. The electromagnetic deflection means 4 deflects the beam 1 to the center of the sub-field 11. In FIG. 2, (x, y) represent the coordinates of a pattern data with respect to, for example, an orthogonal coordinate system whose origin is the center of the sub-field 11, and (X, Y) represent the coordinates of the center of the sub-field 11 with respect to, for example, an orthogonal coordinate system whose origin is the center of the field 10. Generally, the size of the field 10 is 1 mm square to 10 mm square, and that of each sub-field 11 is about 100 μm square. When both of the electromagnetic deflection means 4 and the electrostatic deflection means 5 are employed for the beam deflection as described with reference to FIG. 2, the electromagnetic deflection means 4 deflecting the beam at a low speed is actuated only the number of times equal to the number of the sub-fields 11 which is $10^2$ to $10^4$. Therefore, the writing speed can be greatly increased compared with the case in which the entire field 10 is exposed to the beam deflected by the electromagnetic deflection means 4 alone. This is because, in such a case, the number of times the electromagnetic deflection means 4 is actuated becomes greater by a few order of magnitudes than the number of the sub-fields 11.

The apparatus of such a construction naturally suffers from trapezoidal, rotary, barrel-like or any other type of deflection distortion due to the limit of mechanical precision and positioning errors of the electromagnetic and electrostatic deflection means 4 and 5 and also due to the mutual interference of the magnetic and electric fields. In order to correct such deflection distortion, the deflection signals X, Y and x, y applied from a control computer 6 are suitably transformed into signals X', Y' and x', y', respectively, by associated calibrators 7 and 8 having transformation functions therefor, and these transformed signals X', Y' and x', y' are applied to the electromagnetic and electrostatic deflection means 4 and 5 respectively. That is, the signal transformation functions of the calibrators 7 and 8 are established such that the amount of practical deflection of the beam 1 on the object 3 is in a fixed or definite relation with the deflection data supplied, for the purpose of attaining the deflection amount, from the control computer 6.

The transformation functions used for the signal transformation in the calibrators 7 and 8 associated with the electromagnetic deflection means 4 and electrostatic deflection means 5 have heretofore been determined in a manner which will be described now. Fiducial mark means 3" such as a reference mark is provided on a portion of a stage structure 3' carrying the object 3 thereon, so that the position of the electron beam 1 can be detected. For the purpose of signal transformation in the case of the electromagnetic deflection, the stage structure 3' is moved over a predetermimed distance while measuring the position of the stage structure 3' by a laser interferometer 9. Then, in order to detect the position of the fiducial mark means 3", the electron beam 1 is deflected by the electromagnetic deflection means 4, and the deflection data is picked up at the time of detection of the fiducial mark means 3". In this manner, the relation between the actual moved distance of the fiducial mark means 3" and the corresponding deflection data is sought at a plurality of points covering the entire field, thereby determining the transformation function to be used for the electromagnetic deflection calibration.

For the purpose of signal transformation in the case of the electrostatic deflection, it is necessary to determine the transformation function to be used for the electrostatic deflection calibration in each of the sub-fields, since the magnetic field established by the electromagnetic deflection means 4 intrudes into the electrostatic deflection means 5 thereby the electrostatic deflection of the beam 1. Thus, in the case of the electrostatic deflection calibration, the beam 1 is first electromagnetically deflected to the center 12 of a sub-field 11' to be calibrated, as shown in FIG. 3. Then, the stage structure 3' having the fiducial mark means 3" provided on a portion thereof for the deflection distortion correction purpose is moved to move the fiducial mark means 3" to one of a plurality of points, for example, four points 13 to 16 as shown in FIG. 3, and the electrostatic deflection data required for electrostatically deflecting the beam 1 to that position, at which the fiducial mark means 3" is detected, is measured or calculated. Such measurement is made on all of the required points (usually the four points 13 to 16 above described) distributed within the extent of the sub-field 11', thereby determining the transformation function to be used for the electrostatic deflection calibration in that sub-field 11'. Measurement is similarly conducted on other sub-fields until the transformation functions are determined for all of the necessary sub-fields.

Movement of the stage structure 3', detection of the position of the fiducial mark means 3", determination of the transfer functions, etc. conducted for the purpose of electromagnetic and electrostatic deflection calibration referred to above are described in detail, for example, "J. Vac. Sci. Technology, 16(6)," November/December 1979, pp. 1710–1714 and pp. 1784–1786. Therefore, the above procedures will not be especially explained herein.

According to the prior art method above described, the fiducial mark means provided on the stage structure must be moved to a plurality of required points within the extend of each of necessary sub-fields, and, therefore, a very long period of time is required to complete the electrostatic deflection calibration. Further, heat generated with the movement of the stage structure (for example, heat generated by movement of the moving part of the stage structure and/or the heat electrically generated) acts to raise the temperature of the stage structure, with result that the lithography precision may be considerably degraded.

The present invention obviates the prior art defects, and its principal feature resides in the fact that, instead of moving the stage structure within the extent of a sub-field, the electromagnetic deflection means is previously calibrated in a known manner as, for example, that described hereinbefore, and the calibrated electromagnetic deflection means is used for the calibration of the electrostatic deflection means without moving the stage structure.

Figure 4:
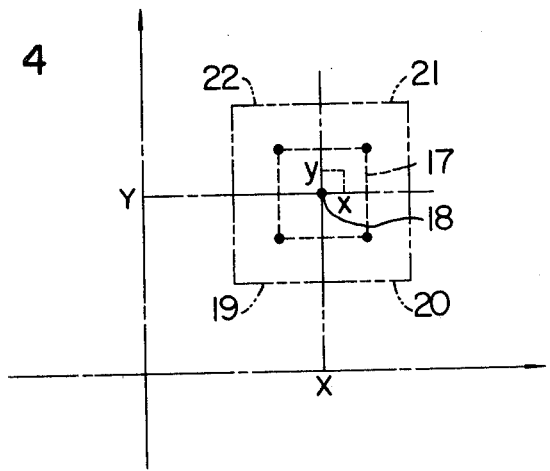
FIG. 4 illustrates how the deflection calibration is carried out by an embodiment of the present invention.

FIG. 4 illustrates the manner of deflection distortion correction and deflection calibration according to an embodiment of the present invention. Referring to FIG. 4, (X, Y) represent the coordinates of the center 18 of a sub-field 17 to be calibrated with respect to an orthogonal coordinate system whose origin is the center of a field, and (x, y) represent the coordinates of the fiducial mark means 3" (FIG. 1), to which the beam is to be moved, with respect to the orthogonal coordinate system whose origin is the center 18 of the sub-field 17. In the prior art method described hereinbefore, the coordinates (X, Y) is attained by the electromagnetic deflection means 4, and the coordinates (x, y) is attained by movement of the stage structure 3'. In contrast to the prior art, the coordinates (x, y) are also attained by the electromagnetic deflection means 4, in the embodiment of the present invention. In FIG. 4, reference numerals 19 to 22 designate sub-fields disposed at positions from which the sub-field 17 is distanced ½ of the length of the sides of the sub-field 17 by parallel movement in the X-direction and/or the Y-direction.

As described already, the size of the sub-fields is usually about 100 μm square and is therefore sufficiently smaller than that of the field which is usually 1 mm square to 10 mm square. The results of an experiment conducted by the inventors have proved that the dependence of the electrostatic deflection transformation function on the electromagnetically deflected beam position in each of the sub-fields is very little, and the distance of the order of the ½ sub-field is practically negligible without giving rise to any problem. According to the prior art method shown in FIG. 3, the point of beam deflection by the electromagnetic deflection means 4 is fixed at the position of the center 12 of the sub-field 11', and the fiducial mark means 3" (FIG. 1) is moved to the plural positions 13 to 16 by movement of the stage structure 3' (FIG. 1). In contrast to the prior art method, the fiducial mark means 3" is fixed at the position of the center 18 of the sub-field 17 to be calibrated, in the embodiment of the present invention illustrated in FIG. 4. Then, the electromagnetic deflection means 4, which has already been calibrated in a known manner, deflects the beam spot to a position represented by the coordinates (X−x, Y−y). This causes a shift from the sub-field 17 to the sub-field 19. Since the stage structure 3' is not moved, the fiducial mark means 3" is now located at a position represented by the coordinates (x, y) when viewed from the center of the sub-field 19. The beam is then deflected by the electrostatic deflection means 5 to detect the position of the fiducial mark means 3", thereby finding the relation (the transfer function) between the electrostatic deflection data and the actual distance of the position (x, y) at that time. (The above distance is ½ of the length of the sides of the sub-field in the embodiment of the present invention.) Then, when the beam spot is deflected by the electromagnetic deflection means 4 to a position represented by the coordinates (X+x, Y−y), the sub-field 20 is now selected. In this case, the fiducial mark means 3" is located at a position represented by the coordinates (−x, y) when viewed from the center of the sub-field 20. The electron beam is similarly deflected by the electrostatic deflection means 5 to find the relation (the transformation function) between the electrostatic deflection data and the actual distance at that time. Thus, the electromagnetic deflection of the beam to a plurality of positions (X∓x, Y∓y) by the calibrated electromagnetic deflection means 4 can exhibit the effect equivalent to that exhibited by the movement of the stage structure 3' to a plurality of positions (±x, ±y) relative to the center 18 of the sub-field 17.

According to the described embodiment of the present invention, therefore, the calibration of electrostatic deflection within the extent of a sub-field can be attained without moving the stage structure, and the length of time required for calibration can be greatly shortened compared with the prior art method. Specifically describing, a length of time of, for example, 0.2 sec/movement or shorter is generally required for movement of the stage structure 3', but a length of time required for deflection of the beam by the electromagnetic deflection means 4 is 100 μsec/deflection at the most even when a considerable waiting time is provided to avoid the adverse effect of the factors including the eddy current. Therefore, according to the prior art method, the movement of the stage structure in the course of calibration alone requires a length of time which amounts to (0.2 sec) × (the number of positions to which the fiducial mark means is moved) × (the number of sub-fields). This length of time is, for example, 0.2 sec×4×500=400 sec. In contrast to the prior art method, the above length of time can be shortened to 100 μsec×4×500=2×10³×10² μsec=0.2 sec according to the embodiment of the present invention. Also, according to the embodiment of the present invention in which the stage structure is not moved but is maintained stationary, errors resulting from thermal expansion due to the heat generated with the movement of the stage structure can be eliminated to greatly improve the lithography precision of the apparatus.

Movement of the stage structure, detection of the position of the fiducial mark means and determination of the transfer functions referred to in the explanation of the embodiment of the present invention are described in detail in, for example, "J. Vac. Technology", 16(6), November/December 1979, pp. 1710–1714 and pp. 1784–1786 cited hereinbefore. Reference is to be made to that paper for details.

We claim:

1. A method of deflection calibration for a charged particle beam exposure apparatus having first deflection means for scanning a relatively large area with a charged particle beam and second deflection means for scanning a relatively small area with said beam, the method comprising:
   calibrating deflection performed by said first deflection means; and
   calibrating deflection performed by said second deflection means using said calibrated first deflection means.

2. A method according to claim 1, in which said first and second deflection means are constituted by electromagnetic deflection means and electrostatic deflection means, respectively.

3. A method of deflection calibration for a charged particle beam exposure apparatus having first deflection means for scanning a relatively large area with a charged particle beam, second deflection means for scanning a relatively small area with said beam and fiducial mark means provided on a stage structure for carrying an object for beam exposure, the method comprising:
   calibrating deflection performed by said first deflection means;
   positioning said fiducial mark means;
   deflecting the beam spot with said calibrated first deflection means to a predetermined position in a plane on said stage structure;
   detecting said fiducial mark means by deflecting said beam with said second deflection means to the location of said fiducial mark means; and
   determining deflection data for said second deflection means for said detection of the location of said fiducial mark means.

4. A method of deflection calibration for a charged particle beam exposure apparatus having electromagnetic deflection means and electrostatic deflection means both for deflecting a charged particle beam, the method comprising:
   calibrating deflection performed by said electromagnetic deflection means;
   positioning fiducial mark means;
   deflecting said beam with said calibrated electromagnetic deflection means to a predetermined position; and
   determining data for electrostatic deflection on the basis of information on the electromagnetic deflection of the beam to said predetermined position with respect to the location of said positioned fiducial mark means.

5. A method according to claim 4, in which the deflection distance of said beam is larger by said electromagnetic deflection means than by said electrostatic deflection means.

6. A method of deflection calibration for a charged particle beam exposure apparatus having electromagnetic deflection means and electrostatic deflection means both for deflecting a charged particle beam spot in a plane on a movable stage structure and fiducial mark means arranged in a fixed relation with said stage structure, the method comprising:

calibrating deflection performed by said electromagnetic deflection means;

positioning said fiducial mark means by moving said stage structure;

deflecting said beam spot with said calibrated electromagnetic deflection means to a predetermined position in said plane;

deflecting said beam spot with said electrostatic deflection means to detect the location of said fiducial mark means; and measuring data for the electrostatic deflection for said detection of the location of said fiducial mark means.

7. An apparatus of deflection calibration in a charged particle beam exposure apparatus having first deflection means for scanning a relatively large area with a charged particle beam, second deflection means for scanning a relatively small area with said beam and fiducial mark means provided on a stage structure for carrying an object for beam exposure, comprising:

means for calibrating deflection performed by said first deflection means;

means for positioning said fiducial mark means;

means for deflecting the beam spot with said calibrated first deflection means to a predetermined position in a plane on said stage structure;

means for detecting said fiducial mark means by deflecting said beam with said second deflection means to the location of said fiducial mark means; and means for determining deflection data for said second deflection means for said detection of the location of said fiducial mark means.

8. An apparatus of deflection calibration in a charged particle beam exposure apparatus having electromagnetic deflection means and electrostatic deflection means both for deflecting a charged particle beam, comprising:

means for calibrating deflection performed by said electromagnetic deflection means;

means for positioning fiducial mark means;

means for deflecting said beam with said calibrated electromagnetic deflection means to a predetermined position; and means for determining data for electrostatic deflection on the basis of information on the electromagnetic deflection of the beam to said predetermined position with respect to the location of said positioned fiducial mark means.

* * * * *